(12) United States Patent
Lian

(10) Patent No.: US 12,002,848 B2
(45) Date of Patent: Jun. 4, 2024

(54) LDMOS HAVING MULTIPLE FIELD PLATES AND ASSOCIATED MANUFACTURING METHOD

(71) Applicant: Chengdu Monolithic Power Systems Co., Ltd., Chengdu (CN)

(72) Inventor: Yanjie Lian, Chengdu (CN)

(73) Assignee: Chengdu Monolithic Power Systems Co., Ltd., Sichuan (CN)

( * ) Notice: Subject to any disclaimer, the term of this patent is extended or adjusted under 35 U.S.C. 154(b) by 264 days.

(21) Appl. No.: 17/582,159

(22) Filed: Jan. 24, 2022

(65) Prior Publication Data

US 2022/0254876 A1 Aug. 11, 2022

(30) Foreign Application Priority Data

Feb. 8, 2021 (CN) .......................... 202110173502.4

(51) Int. Cl.
*H01L 29/06* (2006.01)
*H01L 29/40* (2006.01)
*H01L 29/66* (2006.01)
*H01L 29/78* (2006.01)

(52) U.S. Cl.
CPC ........ *H01L 29/0611* (2013.01); *H01L 29/402* (2013.01); *H01L 29/66681* (2013.01); *H01L 29/7816* (2013.01)

(58) Field of Classification Search
CPC ................. H01L 29/402; H01L 29/404; H01L 29/42368; H01L 29/0611; H01L 29/66681; H01L 29/7816; H01L 29/407
See application file for complete search history.

(56) References Cited

U.S. PATENT DOCUMENTS

| | | | |
|---|---|---|---|
| 10,665,712 B2 | 5/2020 | Braun et al. | |
| 2019/0288112 A1* | 9/2019 | Wang | H01L 29/517 |
| 2021/0036112 A1* | 2/2021 | Xu | H01L 29/66659 |
| 2021/0193805 A1* | 6/2021 | Yoo | H01L 29/404 |

* cited by examiner

*Primary Examiner* — Raj R Gupta
(74) *Attorney, Agent, or Firm* — Perkins Coie LLP

(57) ABSTRACT

An LDMOS having multiple field plates and manufacturing method. The LDMOS has a semiconductor substrate with an upper surface, an interlayer dielectric layer with an upper surface, a gate conducting layer, a field plate barrier layer, a first field plate and a second field plate. The gate conducting layer has a plate portion and a channel portion, the height of the plate portion to the upper surface of the semiconductor substrate is greater than the height of the channel portion to the upper surface of the semiconductor substrate. The field plate barrier layer disposes in the interlayer dielectric layer between the plate portion and the drain. The first field plate disposes in the interlayer dielectric layer and extends from the field plate barrier layer through the interlayer dielectric layer to the upper surface of the interlayer dielectric layer. The second field plate disposes in the interlayer dielectric layer and extends from the field plate barrier layer through the interlayer dielectric layer to the upper surface of the interlayer dielectric layer.

2 Claims, 7 Drawing Sheets

LDMOS HAVING MULTIPLE FIELD PLATES AND ASSOCIATED MANUFACTURING METHOD

CROSS-REFERENCE TO RELATED APPLICATIONS

This application claims the benefit of Chinese Patent Application No. 202110173502.4, filed on Feb. 8, 2021, which is incorporated herein by reference in its entirety.

TECHNICAL FIELD

This disclosure generally relates to a lateral double diffused metal oxide semiconductor field effect transistor (LDMOS), and more particularly but not exclusively relates to an LDMOS having multiple field plates.

BACKGROUND

It is well know that a high voltage LDMOS usually has field plates to increase the breakdown voltage of the LDMOS, and changing thickness of a oxide layer under the field plates can affect electric field distribution. The field plates are distributed between the drain and the gate of the LDMOS, and it is usually desired to have the thickness of the oxide layer under the field plate increases sequentially from the gate to the drain. Usually additional masks are required for manufacturing the oxide layer with a different thicknesses, thus the manufacturing cost of the LDMOS is increased.

Therefore, it is desired to manufacture an oxide layer under the field plates to have an optimized thickness without additional masks.

SUMMARY

In accomplishing the above and other objects, the present invention provides a method for manufacturing an LDMOS. The method comprises forming a first gate oxide and a second gate oxide simultaneously on a semiconductor substrate, and forming a gate above the second gate oxide, wherein the gate has a source side and a drain side. The method also comprises forming a body in the semiconductor substrate on the source side of the gate, forming a drain in the semiconductor substrate on the drain side of the gate, and forming a source in the body. The method further comprises forming a field plate oxide layer, forming a field plate barrier layer, forming a dielectric layer on the field plate barrier layer, and forming a first field plate and a second field plate. Wherein the field plate oxide layer is formed on the first gate oxide, and the semiconductor substrate between the first gate oxide and the second gate oxide. The field plate barrier layer is formed on the field plate oxide layer. The dielectric layer is formed on the field plate barrier layer. The dielectric layer has an upper surface, the first field plate is in the dielectric layer and above the first gate oxide, and the second field plate is in the dielectric layer and between the first gate oxide and the second gate oxide.

The present invention provides an LDMOS, the LDMOS comprises a semiconductor substrate, a first gate oxide and a second gate oxide, a gate formed on the semiconductor substrate and a portion of the second gate oxide. Wherein the first gate oxide and the second gate oxide are disposed on the semiconductor substrate, the gate has a source side and a drain side. The LDMOS also comprises a body, a source a drain and a field plate oxide layer. Wherein the body is disposed in the semiconductor substrate and extending from the source side of the gate to under the gate, the source is disposed in the body, the drain is disposed in the semiconductor substrate on the drain side of the gate, the field plate oxide layer is disposed on the first gate oxide, and the semiconductor substrate between the first gate oxide and the second gate oxide. The LDMOS further comprises a field plate barrier layer, a dielectric layer, a first field plate and a second filed plate. Wherein the field plate barrier layer is disposed above the field plate oxide layer, the dielectric layer is overlying the field plate barrier layer, and the dielectric layer has an upper surface. The first field plate is disposed in the dielectric layer above the first gate oxide and extending from the field plate barrier layer through the dielectric layer to the upper surface of the dielectric layer. The second field plate is disposed in the dielectric layer between the first gate oxide and the second gate oxide, and extending from the field plate barrier layer through the dielectric layer to the upper surface of the dielectric layer.

The present invention provides an LDMOS, the LDMOS comprises a semiconductor substrate having an upper surface, a source and a drain formed in the semiconductor substrate, an interlayer dielectric layer covering the upper surface of the semiconductor substrate. Wherein the interlayer dielectric layer has an upper surface. The LDMOS further comprises a gate conducting layer disposed in the interlayer dielectric layer between the source and drain. Wherein the gate conducting layer is disposed in the interlayer dielectric layer between the source and drain, the gate conducting layer comprises a plate portion and a channel portion, the height of the plate portion to the upper surface of the semiconductor substrate is greater than the height of the channel portion to the upper surface of the semiconductor substrate. The LDMOS still comprises a field plate barrier layer, a first field plate and a second field plate. Wherein the first field plate is disposed in the interlayer dielectric layer and extending from the field plate barrier layer through the interlayer dielectric layer to the upper surface of the interlayer dielectric layer and a second field plate. The first field plate has a lower surface in contact with the field plate barrier layer. The second field plate is disposed in the interlayer dielectric layer and extending from the field plate barrier layer through the interlayer dielectric layer to the upper surface of the interlayer dielectric layer, and the second field plate has a lower surface in contact with the field plate barrier layer. The LDMOS still comprises a field plate barrier layer disposed in the interlayer dielectric layer between the plate portion and the drain, wherein the height of the lower surface of the first field plate to the upper surface of the semiconductor substrate is greater than the height of the lower surface of the second field plate to the upper surface of the semiconductor substrate, and the height of the lower surface of the second field plate to the upper surface of the semiconductor substrate is greater than the height of the plate portion to the upper surface of the semiconductor substrate.

BRIEF DESCRIPTION OF THE DRAWINGS

The following detailed description of various embodiments of the present invention can best be understood when read in conjunction with the following drawings, in which the features are not necessarily drawn to scale but rather are drawn as to best illustrate the pertinent features.

DETAILED DESCRIPTION

Various embodiments of the present invention will now be described. In the following description, some specific details, such as example circuits and example values for these circuit components, are included to provide a thorough understanding of the embodiments. One skilled in the relevant art will recognize, however, that the present invention can be practiced without one or more specific details, or with other methods, components, materials, etc. In other instances, well-known structures, materials, processes or operations are not shown or described in detail to avoid obscuring aspects of the present invention.

Throughout the specification and claims, the term "coupled," as used herein, is defined as directly or indirectly connected in an electrical or non-electrical manner. The terms "a," "an," and "the" include plural reference, and the term "in" includes "in" and "on". The phrase "in an embodiment," as used herein does not necessarily refer to the same embodiment, although it may. The term "or" is an inclusive "or" operator, and is equivalent to the term "and/or" herein, unless the context clearly dictates otherwise. The term "based on" is not exclusive and allows for being based on additional factors not described, unless the context clearly dictates otherwise. The term "circuit" means at least either a single component or a multiplicity of components, either active and/or passive, that are coupled together to provide a desired function. The term "signal" means at least one current, voltage, charge, temperature, data, or other signal. Where either a field effect transistor ("FET") or a bipolar junction transistor ("BJT") may be employed as an embodiment of a transistor, the scope of the words "gate", "drain", and "source" includes "base", "collector", and "emitter", respectively, and vice versa. Those skilled in the art should understand that the meanings of the terms identified above do not necessarily limit the terms, but merely provide illustrative examples for the terms.

Figure 1:
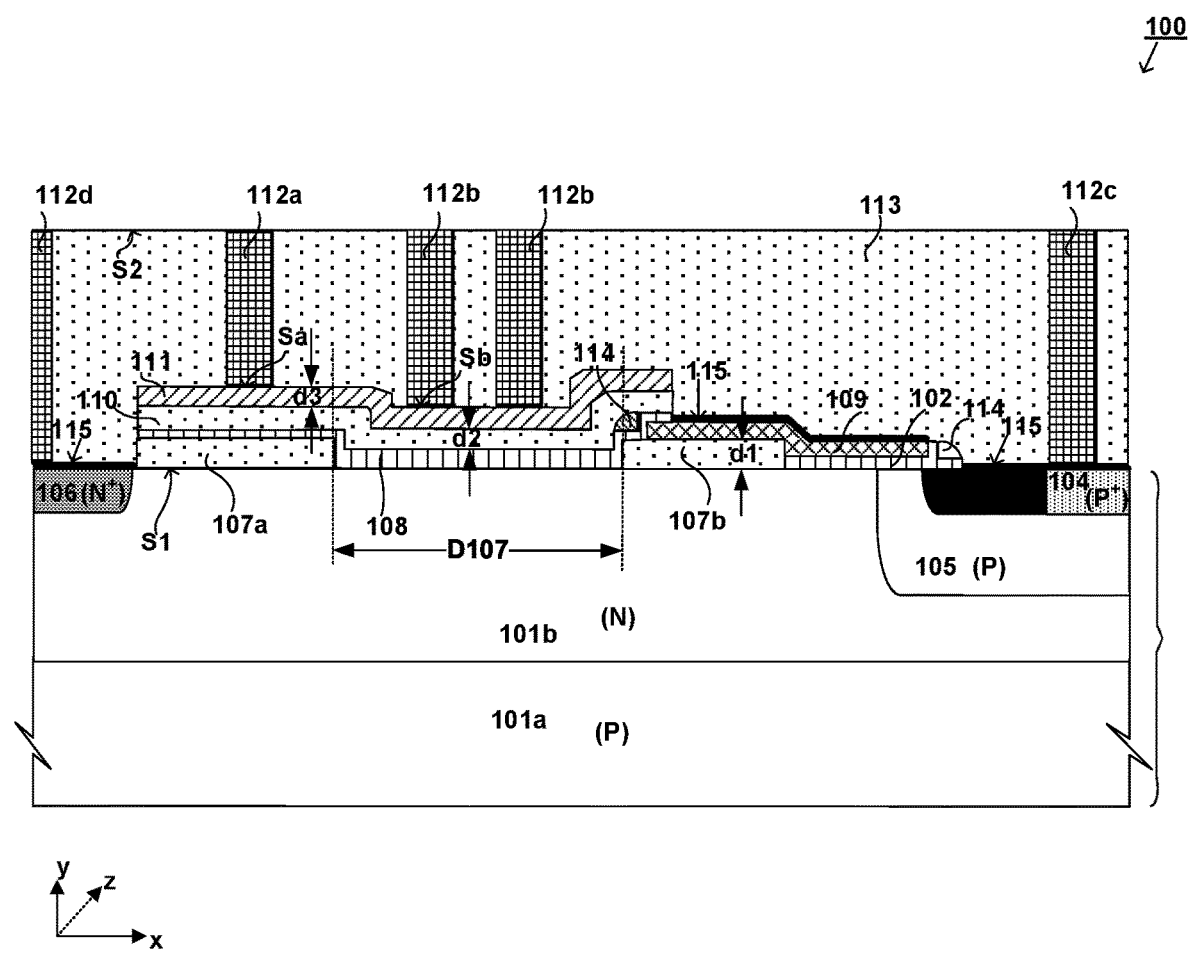
FIG. 1 illustrates a cross-sectional view of an LDMOS 100 according to an embodiment of the present invention.

FIG. 1 illustrates a cross-sectional view of an LDMOS 100 according to an embodiment of the present invention. The cross-sectional view is shown in a three-dimensional coordinate system defined by the mutually perpendicular x-axis, y-axis, and z-axis and the cross-sectional view is cutting the LDMOS 100 from a plane defined by the x and y axis. Throughout this disclosure, lateral refers to a direction parallel to the x axis while vertical refers to a direction parallel to the y axis. The LDMOS 100 may comprise a semiconductor substrate 101, a source 103 and a drain 106. The semiconductor substrate 101 comprises an initial substrate 101a having a first conductivity type (the first conductivity type is P-type in the embodiment shown in FIG. 1), and a drift region 101b having a second conductivity type (the second conductivity type is N-type). The source 103 is the second conductivity type and is formed in the drift region 101b. The source 103 is separated from the drift region 101b by a body 105 having a first conductivity type. The source 103 has a heavier doping concentration than the drift region 101b (the doping type and concentration of the source 103 is denoted as N+ in FIG. 1). The LDMOS 100 may further comprise a body contact 104, the body contact 104 is disposed in the body 105 and has a heavier doping concentration than the body 105 (the doping type and concentration of the body 105 is denoted as P+ in FIG. 1). The drain 106 has a second conductive type and is formed in the drift region 101b. The drain 106 is separated from the source 103, and has a heavier doping concentration than the drift region 101b (the doping type and concentration of the drain 106 is denoted by N+ in FIG. 1).

Still referring to FIG. 1, as the embodiment shown in FIG. 1, the LDMOS 100 further comprises a first gate oxide 107a, a second gate oxide 107b, a gate having a source side and a drain side, a field plate oxide layer 110, and a field plate barrier layer 111. The body 105 is formed in the semiconductor substrate 101 on the source side of the gate, while the drain 106 is formed in the semiconductor substrate 101 on the drain side of the gate. Both the first gate oxide 107a and the second gate oxide 107b are located above semiconductor substrate 101 between the drain 106 and the body 105, and the first gate oxide 107a is close to the drain 106, the second gate oxide 107b is close to the source 103, and the spacing between the first gate oxide 107a and the second gate oxide 107b is denoted as spacing D107, wherein the first gate oxide 107a and the second gate oxide 107b are formed simultaneously by the same process. Specifically, the first gate oxide 107a and the second gate oxide 107b are formed in the same step using the same mask, and the thickness and material of the first gate oxide 107a and the second gate oxide 107b are the same. In an embodiment, the first gate oxide 107a and the second gate oxide 107b may comprise silicon dioxide or silicon nitride. In another embodiment, the first gate oxide 107a and the second gate oxide 107b may comprise one or more of some oxide materials, such as SiO2, SOG, USG, BPSG, PSG and PETEOS. In an embodiment, the thickness of the first gate oxide 107a (denoted as d1) is 200 Å-500 Å. It should be appreciated that if the spacing D107 is too short, the peak electric field formed at the terminal of a second field plate 112b can not be effectively reduced, and if the spacing D107 is too long, the size of the LDMOS increases, so the spacing D107 needs to be precisely designed and controlled. In an embodiment, the spacing D107 is between 0.5 μm and 1.5 μm. In another embodiment, the spacing D107 is related to the breakdown voltage of the LDMOS.

The gate comprises a gate insulating layer 102 and a gate conducting layer 109, wherein the gate conducting layer 109 formed on the semiconductor substrate 101 and a portion of the second gate oxide 107b, the gate has a source side and a drain side. In an embodiment, the gate conducting layer 109 comprises polysilicon. In other embodiments, the gate conducting layer 109 may comprise combinations of some conductive materials. It should be understood that the gate insulating layer 102 and the first gate oxide 107a (the second gate oxide 107b) are marked in a different style in FIG. 1 is only for ease of identification, and in some embodiments, the gate insulating layer 102 and the first gate oxide 107a (the second gate oxide 107b) are of the same material. The thickness variation of the gate insulating layer 102 significantly affects the threshold voltage of the LDMOS, so the thickness of the gate insulating layer 102 is relatively fixed in a process, and it is not possible to adjust the thickness of the oxide layer under the field plates by adjusting the thickness of the gate insulating layer 102.

The field plate oxide layer 110 disposed on the first gate oxide 107a, and the semiconductor substrate 101 between the first gate oxide 107a and the second gate oxide 107b. In an embodiment, the field plate oxide layer 110 is also disposed on a portion of the gate conducting layer 109. In an embodiment, the thickness of the field plate oxide layer 110 (denoted as d2) can be neither less than the thickness d1 of the first gate oxide 107a nor greater than 10 times the thickness d1 of the first gate oxide 107a. In an embodiment, the field plate oxide layer 110 comprises silicon dioxide and\or silicon nitride. In another embodiment, the field plate oxide layer 110 and the first gate oxide 107a, and the gate insulating layer 102 are all made of the same material.

The field plate barrier layer 111 is on the field plate oxide layer 110, and extends from the first gate oxide 107a to the second gate oxide 107b. In the embodiment shown in FIG. 1, the field plate barrier layer 111 extends to only a portion of the field plate oxide layer 110 on the second gate oxide 107b so as not to effect the subsequent effective ohmic contact in the gate conducting layer 109. In an embodiment, the field plate barrier layer 111 may comprise one or more of a group of non-conductive nitride, or other semiconductor nitride. In another embodiment, the field plate barrier layer 111 may comprise silicon nitride (Si3N4).

In the embodiment shown in FIG. 1, the LDMOS 100 also comprises a sidewall 114 and a metal silicide 115. In an embodiment, the sidewall 114 comprises nitride, such as SiN. In another embodiment, the sidewall 114 comprises an oxide, such as SiO2, SiOC, etc. The sidewall 114 may be made of an insulating material or the same material as the gate conducting layer 109, depending on the purpose. When the sidewall 114 is configured to prevent a short circuit between metal silicide 115 (metal silicide 115 is formed by covering a thin layer of high conductivity material, such as tungsten or titanium, on the gate conducting layer 109, the source, the drain, and the body contact region), the sidewall 114 is made of an insulating material. When the sidewall 114 is configured to take block effect during injection, the sidewall 114 can be made of polysilicon. For example, when a low-voltage LDMOS is manufactured, the sidewall 114 is formed of polysilicon to block ion injection.

As in the embodiment shown in FIG. 1, the LDMOS 100 may also comprise a dielectric layer 113, a first field plate 112a, a second field plate 112b, a source contact 112c, and a drain contact 112d. In the embodiment shown in FIG. 1, the dielectric layer 113 has an upper surface S2 and overlies the field plate barrier layer 111, the gate, the source 103, and the drain 106. The first field plate 112a is located in the dielectric layer 113 above the first gate oxide 107a and extends from the field plate barrier layer 111 through the dielectric layer 113 to the upper surface S2 of the dielectric layer 113. The second field plate 112b is located in the dielectric layer 113 between the first gate oxide 107a and the second gate oxide 107b and extends from the field plate barrier layer 111 through the dielectric layer 113 to the upper surface S2 of the dielectric layer 113. The source contact 112c is formed in the dielectric layer 113 above the source 103 for coupling the source 103 to the desired potential terminal. The drain contact 112d is formed in the dielectric layer 113 above the drain 106 for coupling the drain 106 to the desired potential terminal. In an embodiment, the first field plate 112a comprises polysilicon or metal. In another embodiment, the first field plate 112a, the second field plate 112b, the source contact 112c, and the drain contact 112d have the same material and are manufactured in the same process step.

In the embodiment shown in FIG. 1, the first field plate 112a has a lower surface Sa in contact with the field plate barrier layer 111, and the second field plate 112b has a lower surface Sb in contact with the field plate barrier layer 111. The height of the lower surface Sa of the first field plate 112a to the upper surface S1 of the semiconductor substrate 101 is equal to the sum of the thickness d1 of the first gate oxide 107a and the thickness d2 of the field plate oxide layer 110 (usually the thickness of the field oxide 108, and the thickness d3 of the field plate barrier layer 111 are neglected here because it is relatively thin), and the height from the lower surface Sb of the second field plate 112b to the upper surface S1 of the semiconductor substrate 101 is equal to the thickness d2 of the field plate oxide layer 110, so it can be seen from the embodiment shown in FIG. 1 that the height difference between the height from the lower surface Sa to the upper surface S1 and the height from the lower surface Sb to the upper surface S1 is equal to the thickness d1 of the first gate oxide 107a. If the thickness d1 of the first gate oxide 107a is too thick, the peak electric field generated near the junction formed in the well 101b and the body 105 due to the curvature effect cannot be effectively reduced. If the thickness d1 of the first gate oxide 107a is too thin, the electric field distribution in the drift region 101b under the first field plate 112a and the second field plate 112b is not good. Therefore, a reasonable design of the thickness d1 of the first gate oxide 107a can effectively optimize the electric field distribution of the drift region 101b under the first field plate 112a and the second field plate 112b, and thus the peak electric field value is reduced and the breakdown voltage value of the LDMOS is increased.

It should be understood by those skilled in the art that the material, and regions listed above, such as the field plate barrier layer 111 and the dielectric layer 113, are merely examples for a better understanding of the present invention and are not intended to be limiting.

Figure 2:
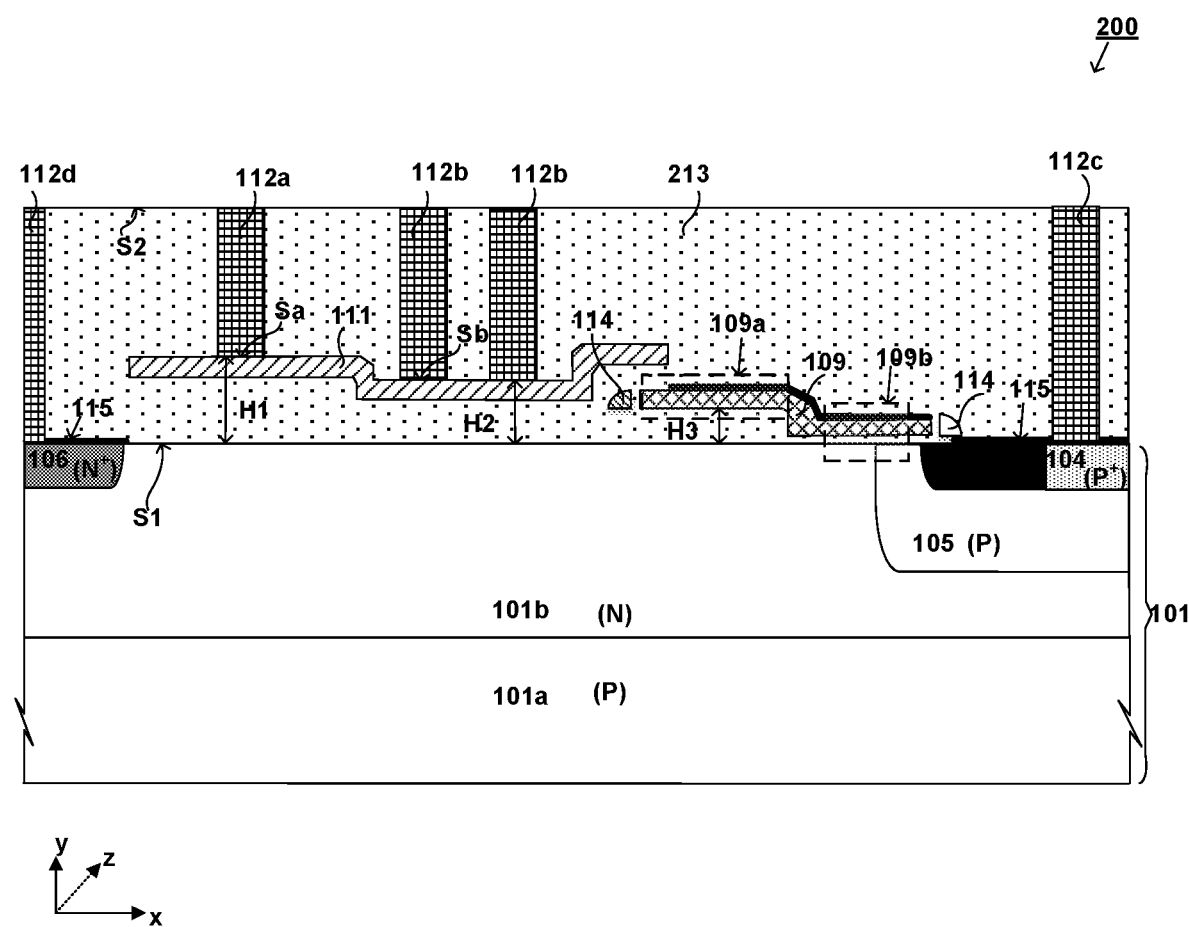
FIG. 2 illustrates a cross-sectional view of an LDMOS 200 according to an embodiment of the present invention.

FIG. 2 illustrates a cross-sectional view of an LDMOS 200 according to an embodiment of the present invention. The description of the LDMOS 100 shown in FIG. 1 has described that the material of the first gate oxide 107a, the second gate oxide 107b, the gate insulating layer 102, the field oxide 108, and the dielectric layer 113 may be the same, the LDMOS 200 shown in FIG. 2 illustrates such an embodiment. Since the first gate oxide 107a, the second gate oxide 107b, the gate insulating layer 102, the field oxide 108, and the dielectric layer 113 are all of the same material, they are all referred to as a interlayer dielectric layer 213, and the other description can refer to the description in FIG. 1.

In FIG. 2, the LDMOS 200 comprises a well 101b formed in the semiconductor substrate 101, a body 105 formed in the well 101b, a source 103 formed in the body 105, and a drain 106. The semiconductor substrate 101 has an upper surface S1. The interlayer dielectric layer 213 covers the upper surface S1 of the semiconductor substrate 101 and has an upper surface S2. In an embodiment, the interlayer dielectric layer 213 comprises oxide or nitride. The LDMOS 200 comprises a gate conducting layer 109, the gate conducting layer 109 being located in the interlayer dielectric layer 213 between the source 103 and the drain 106. The gate conducting layer 109 comprises a plate portion 109a and a channel portion 109b, wherein the height of the plate portion 109a to the upper surface S1 of the semiconductor substrate 101 is greater than the height of the channel portion 109b to the upper surface S1 of the semiconductor substrate 101. The height of the plate portion 109a to the upper surface S1 of the semiconductor substrate 101 refers to the height H3 of the lower surface of the plate portion 109a to the upper surface S1 of the semiconductor substrate 101, and the height of the channel portion 109b to the upper surface S1 of the semiconductor substrate 101 refers to the height of the lower surface of the channel portion 109b to the upper surface S1 of the semiconductor substrate 101. The LDMOS 200 further comprises the field plate barrier layer 111, the first field plate 112a and the second field plate 112b, wherein the field plate barrier layer 111 is located in the interlayer dielectric layer 213 between the plate portion 109a and the drain 106. The first field plate 112a is disposed in the interlayer dielectric layer 213 and has a lower surface Sa in contact the field plate barrier layer 111. The first field plate 112a extends from the field plate barrier layer 111 through the interlayer dielectric layer 213 to the upper surface S2 of the interlayer dielectric layer 213. The second field plate 112b that is located in the interlayer dielectric layer 213 and has a lower surface Sb in contact with the field plate barrier layer 111. The second field plate 112b extends from the field plate barrier layer 111 through the interlayer dielectric layer 213 to the upper surface S2 of the interlayer dielectric layer 213. In FIG. 2, wherein the height H1 of the lower surface of the first field plate 112a Sa to the upper surface S1 of the semiconductor substrate 101 is greater than the height H2 of the lower surface Sb of the second field plate 112b to the upper surface S1 of the semiconductor substrate 101, and the height H2 of the lower surface Sb of the second field plate 112b to the upper surface S1 of the semiconductor substrate 101 is greater than the height H3 of the plate portion 109a to the upper surface S1 of the semiconductor substrate 101.

Figure 3:
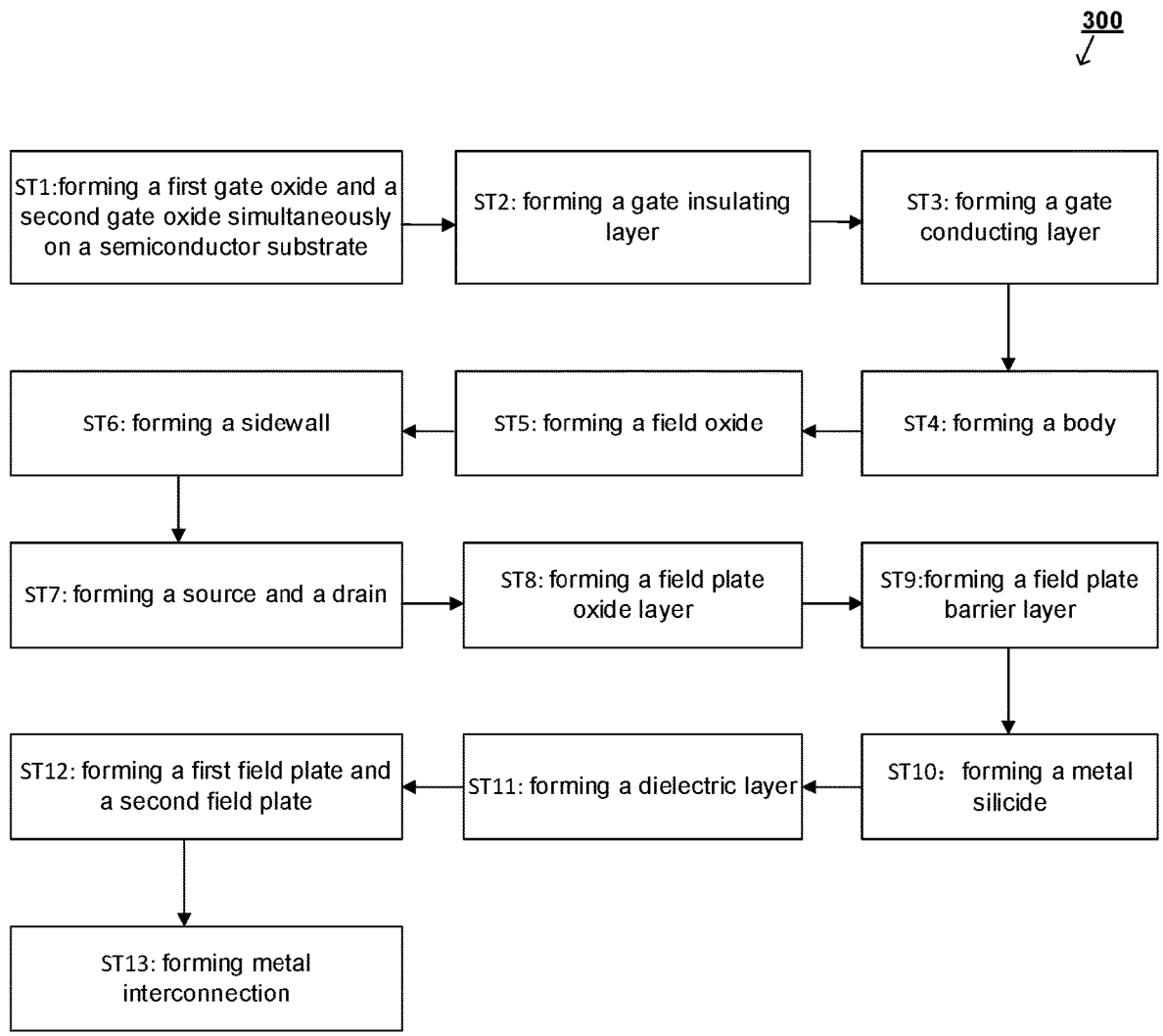
FIG. 3 illustrates a flow chart of a method 300 for manufacturing an LDMOS according to an embodiment of the present invention.

FIG. 3 illustrates a flow chart of a method 300 for manufacturing an LDMOS according to an embodiment of the present invention. The method 300 comprises steps ST1-ST13.

Step ST1: forming a first gate oxide and a second gate oxide simultaneously on a semiconductor substrate.

Step ST2: forming a gate insulating layer.

Step ST3: forming a gate conducting layer.

Step ST4: forming a body. In an embodiment, ion injection is used to form the body.

Step ST5: forming a field oxide.

Step ST6: forming a sidewall.

Step ST7: forming a source and a drain.

Step ST8: forming a field plate oxide layer.

Step ST9: forming a field plate barrier layer.

Step ST10: forming a metal silicide.

Step ST11: forming a dielectric layer.

Step ST12: forming a first field plate and a second field plate.

Step ST13: forming metal interconnection.

It should be known to those skilled in the art that FIG. 3 only exemplifies some exemplary steps, some additional steps may be required in order to improve the specific performance of the LDMOS. Some subsequent steps, such as the step of forming multilayer metal interconnection may be required to form the potential connection of the source and the drain of the LDMOS, which are not be described in detail here.

FIGS. 4A-4K illustrate a cross-sectional view of an LDMOS in some steps of the method 300 according to an embodiment of the present invention.

Figure 4A:
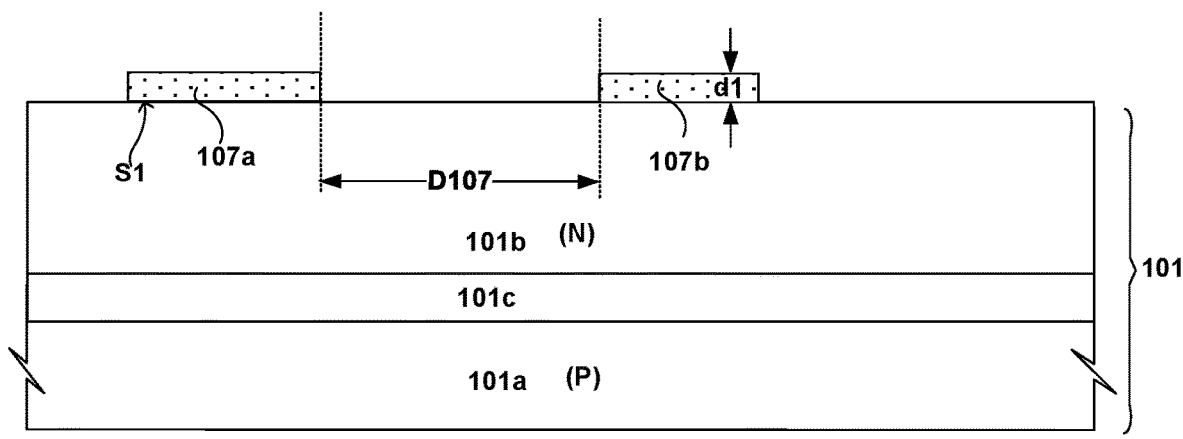
FIGS. 4A-4K illustrate a cross-sectional view of an LDMOS in some steps of the method 300 according to an embodiment of the present invention.

Step ST1 in the method 300, the first gate oxide 107a and the second gate oxide 107b are formed simultaneously on semiconductor substrate 101 is described in FIG. 4A. As shown in FIG. 4A, the semiconductor substrate 101 comprises an initial substrate 101a, a well 101b and a buried layer 101c, wherein the well 101b is also referred to as a drift region 101b. In an embodiment, the initial substrate 101a may be silicon, germanium, SIC or any suitable semiconductor material. In an embodiment, the buried layer 101c is N-type and can reduce the leakage current and parasitic parameters of the LDMOS. It should be noted that the semiconductor substrate 101 illustrated in FIG. 4A is only for exemplary, when a PMOS device is integrated in the semiconductor substrate 101, the semiconductor substrate 101 may have other regions.

Continuing with the illustration of FIG. 4A, the first gate oxide 107a and the second gate oxide 107b are formed simultaneously on the well 101b, wherein the first gate oxide 107a and the second gate oxide 107b have the same thickness and material. In an embodiment, the step of forming the first gate oxide 107a and the second gate oxide 107b comprises a step of forming a gate oxide layer formed by chemical vapor deposition or thermal growth, and a step of forming a desired shape by a photolithography process and an etching process, wherein the photolithography process comprises: applying a photoresist to the gate oxide layer, exposing to UV with the gate oxide mask, and etching of the exposed photoresist. In an embodiment, the first gate oxide 107a has a thickness d1 in a range from 200 Å to 500 Å. If the first gate oxide 107a is too thick, the peak electric field generated near the junction formed in the drift region 101b and the body 105 (subsequently generated) cannot be effectively reduced due to the curvature effect. If the first gate oxide 107a is too thin, the height difference between the height of the first field plate 112a to the upper surface S1 of the semiconductor substrate 101 and the height of the second field plate 112b to the upper surface S1 of the semiconductor substrate 101 is not obvious, and the electric field distribution in the drift region 101b under the first field plate 112a and the second field plate 112b is not good, so the thickness d1 of the first gate oxide 107a (and the thickness d1 of the second gate oxide 107b) needs to be precisely controlled and designed. It should be known that if the spacing D107 between the first gate oxide 107a and the second gate oxide 107b is too short, the secondary peak electric field formed at the terminal of the second field plate 112b due to the second field plate 112b cannot be effectively reduced, and if the spacing D107 is too long, the size of the LDMOS will be increased significantly, so the spacing D107 between the first gate oxide 107a and the second gate oxide 107b also needs to be precisely designed and controlled. In an embodiment, the spacing D107 between the first gate oxide 107a and the second gate oxide 107b is between 0.5 μm and 1.5 μm. In another embodiment, the spacing D107 between the first gate oxide 107a and the second gate oxide 107b is related to the size of the LDMOS and the breakdown voltage of the LDMOS.

In FIGS. 4B to 4K, the N-type buried layer 101c is not shown for clarity, and the semiconductor substrate 101 is only selectively exemplified with the initial substrate 101a and the well 101b.

Figure 4B:
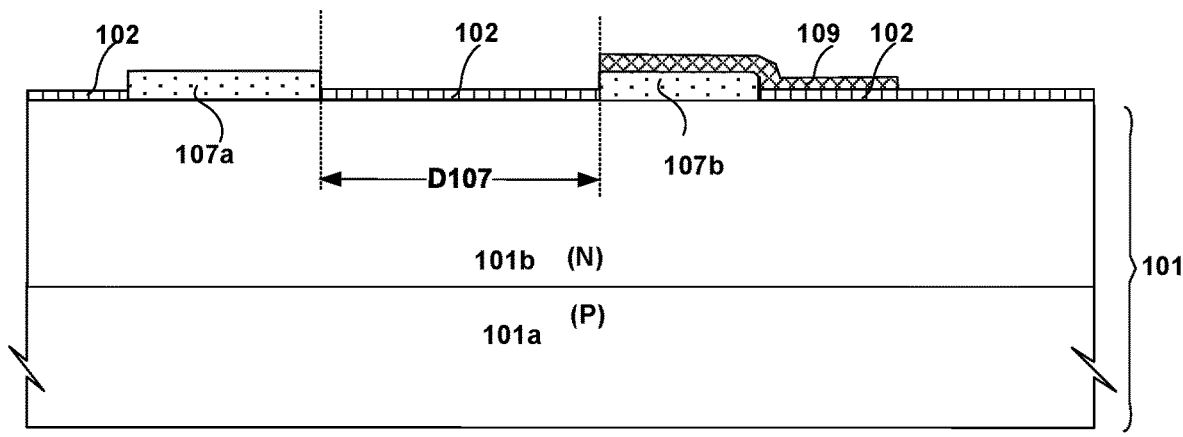

Referring to FIG. 4B, step ST3 for forming the gate conducting layer 109 in method 300 is described. It is to be appreciated that step ST2 of forming for the gate insulating layer 102 is required prior to step ST3. In an embodiment, the gate insulating layer 102 is formed by thermal growth. In an embodiment, the thickness of the gate insulating layer 102 is between 60 Å and 200 Å. In the embodiment shown in FIG. 4B, forming the gate conducting layer 109 comprises forming the gate conductive layer by chemical vapor deposition and forming the gate conducting layer 109 by a photolithography process and an etching process.

Figure 4C:
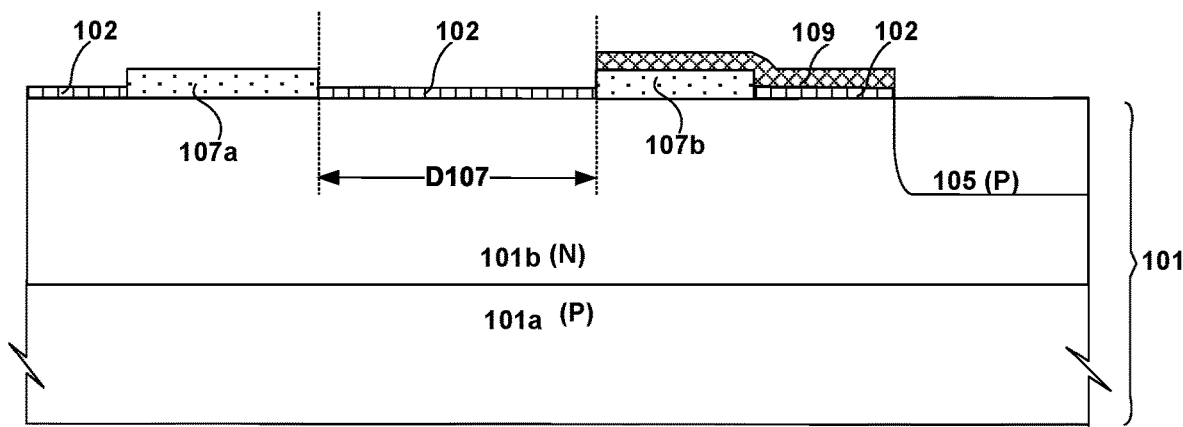

Referring to FIG. 4C, step ST4 for forming the body 105 in method 300 is described. In an embodiment, forming the body 105 requires a photolithography process and ion implantation. In an embodiment, the gate insulating layer 102 and the gate conducting layer 109 together are defined as the gate of the LDMOS, the gate has a source side and a drain side. The body 105 is formed in the semiconductor substrate 101 on the source side of the gate.

Figure 4D:
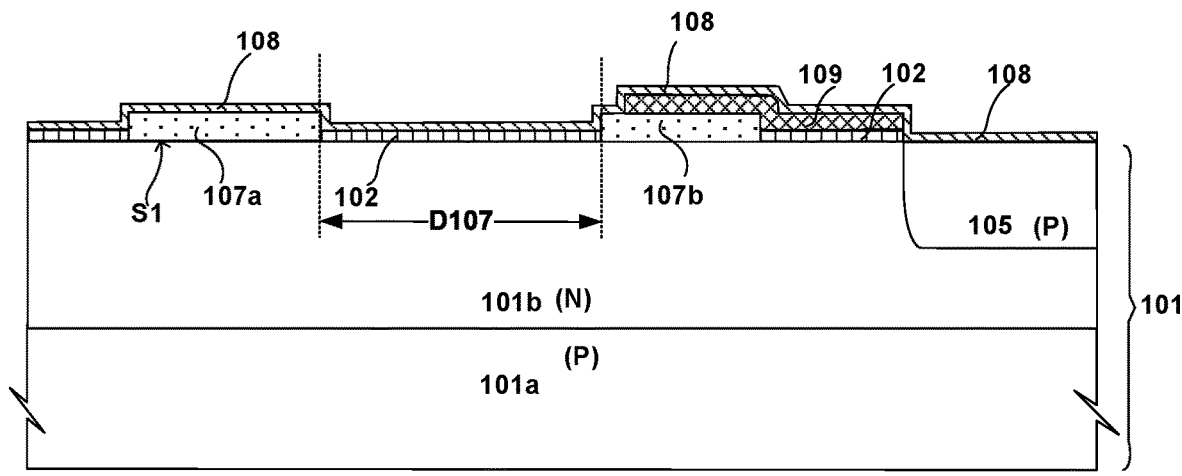

Referring to FIG. 4D, step ST5 for forming field oxide 108 in method 300 is described. In an embodiment, the field oxide 108 is formed by thermal growth or chemical vapor deposition. The field oxide 108 covers the surface of the gate conducting layer 109 to provide protection for the gate conducting layer 109.

Figure 4E:
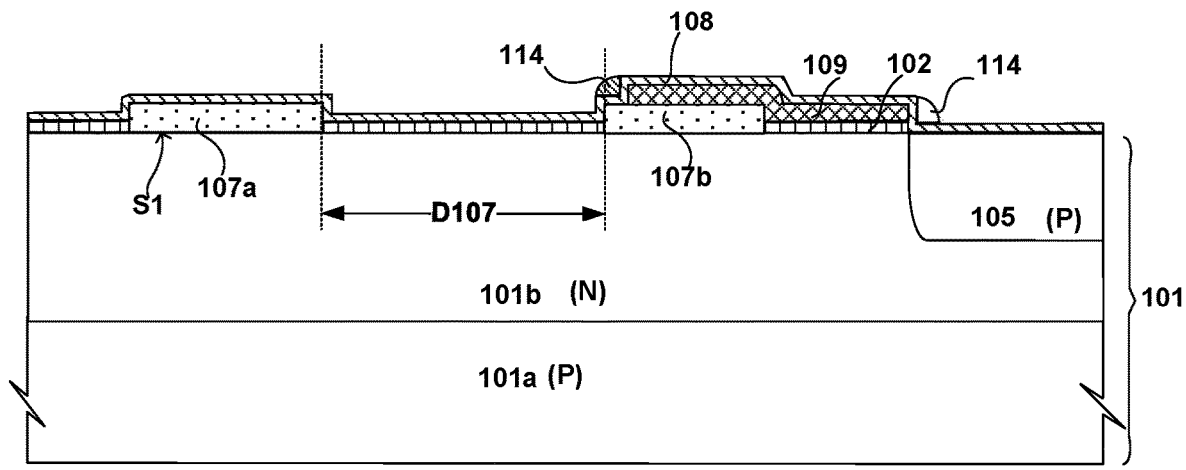

Referring to FIG. 4E, step ST6 for forming the sidewall 114 in method 300 is described. A sidewall layer is deposited on the field oxide 108, and after etching of the sidewall layer, the sidewall 114 is formed on the side of the gate conducting layer 109. In an embodiment, the sidewall 114 comprises nitride. In another embodiment, the sidewall 114 comprises oxide, such as SiO2, SiOC, etc.

Because the field oxide 108 and the gate insulating layer 102 typically comprise the same material, such as a mixture of silicon dioxide and silicon nitride, portions of the gate insulating layer 102 and the field oxide 108 in FIGS. 4f-4k are no longer shown separately, but only the gate insulating layer 102 is denoted for clarity.

Figure 4F:
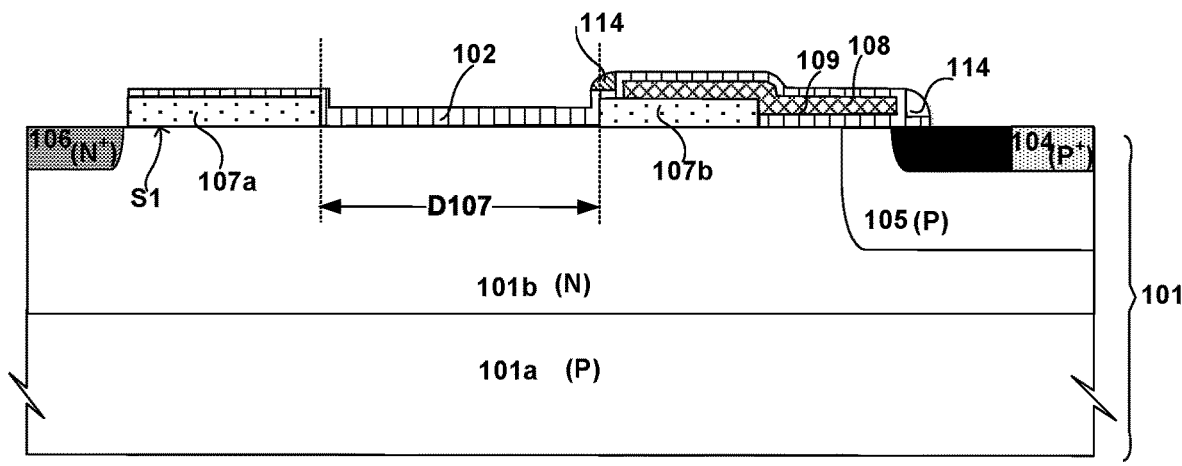

Referring to FIG. 4F, step ST7 for forming the source 103 and the drain 106 in method 300 is described. In the embodiment shown in FIG. 4F, ion injection is used to form the source 103 and the drain 106. In the embodiment shown in FIG. 4F, ion injection of the second conductivity type is performed to form the source 103 and the drain 106, and an ion injection of the first conductivity type is followed to form the body contact region 104. In an embodiment, the drain 106 is formed in the semiconductor substrate 101 on the drain side of the gate.

Figure 4G:
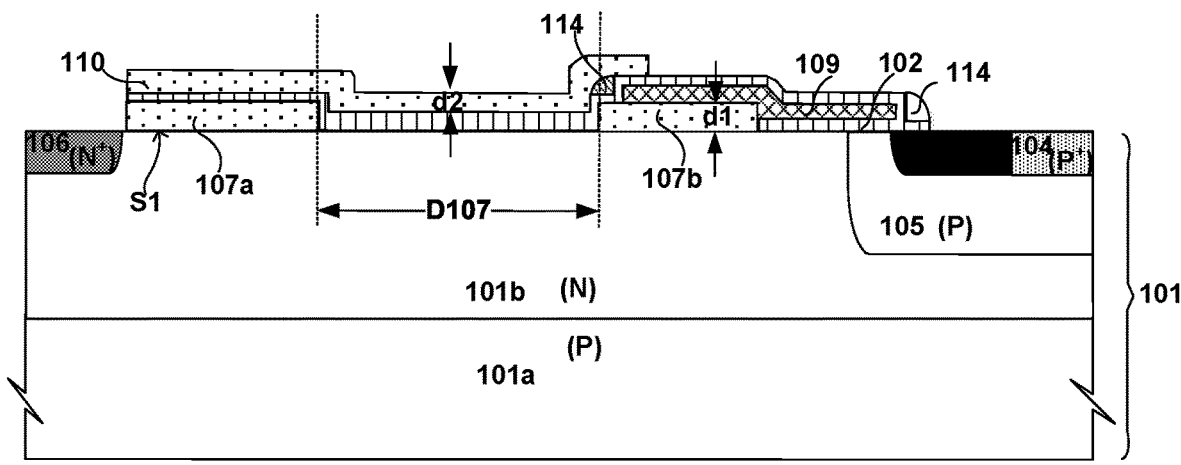

Referring to FIG. 4G, step ST8 for forming the field plate oxide layer 110 in method 300 is described. In an embodiment, the field plate oxide layer 110 is formed by thermal growth or chemical vapor deposition. In an embodiment, the field plate oxide layer 110 the field oxide 108, the gate insulating layer 102, and the first gate oxide 107a comprise the same material. In an embodiment, the field plate oxide layer 110 comprises a mixture of silicon dioxide and silicon nitride. In an embodiment, the thickness d2 of the field plate oxide layer 110 is between 500 Å-2000 Å. In an embodiment, the height of the lower surface Sb of the second field plate 112b (subsequently generated) to the upper surface S1 of the semiconductor substrate 101, the thickness of the oxide layer between the second field plate 112b and the upper surface S1 of the semiconductor substrate 101, can be changed by varying the thickness of the field plate oxide layer 110, thereby affecting the electric field distribution in the well 101b under the second field plate 112b, so the thickness of the field plate oxide layer 110 are required to be precise controlled and designed.

Figure 4H:
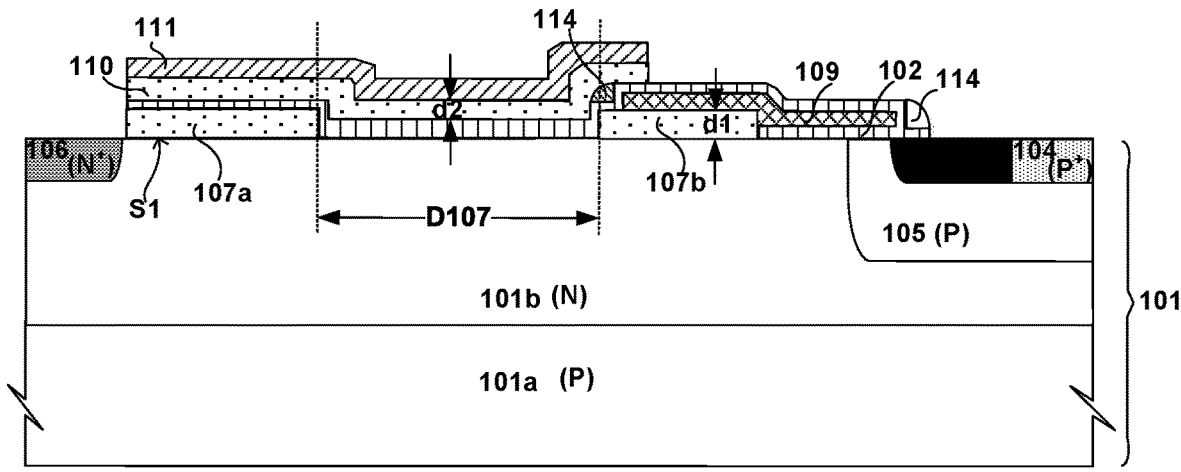

Referring to FIG. 4H, step ST9 for forming the field plate barrier layer 111 in method 300 is described. In the embodiment shown in FIG. 4H, the field plate barrier layer 111 is formed by chemical vapor deposition of nitride. It is noted that the field plate barrier layer 111 may be not so thick as to affect the subsequent formation of an effective ohmic contact in the gate conducting layer 109. In an embodiment, the field plate barrier layer 111 has a thickness d3 between 200 Å and 500 Å.

Figure 4I:
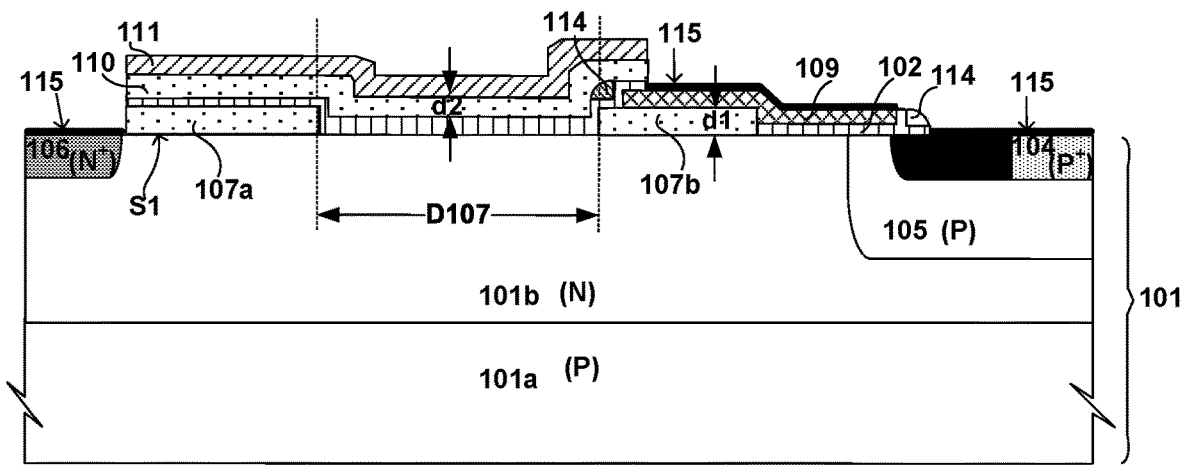

Referring to FIG. 4I, step ST10 of forming the metal silicide 115 in method 300 is described. In an embodiment, the metal silicide 115 may be formed by covering the surface of the gate conducting layer 109 and the active region (source, drain, body contact region, etc.) with a thin layer of a high conductivity material, such as titanium silicide or tungsten silicide.

Figure 4J:
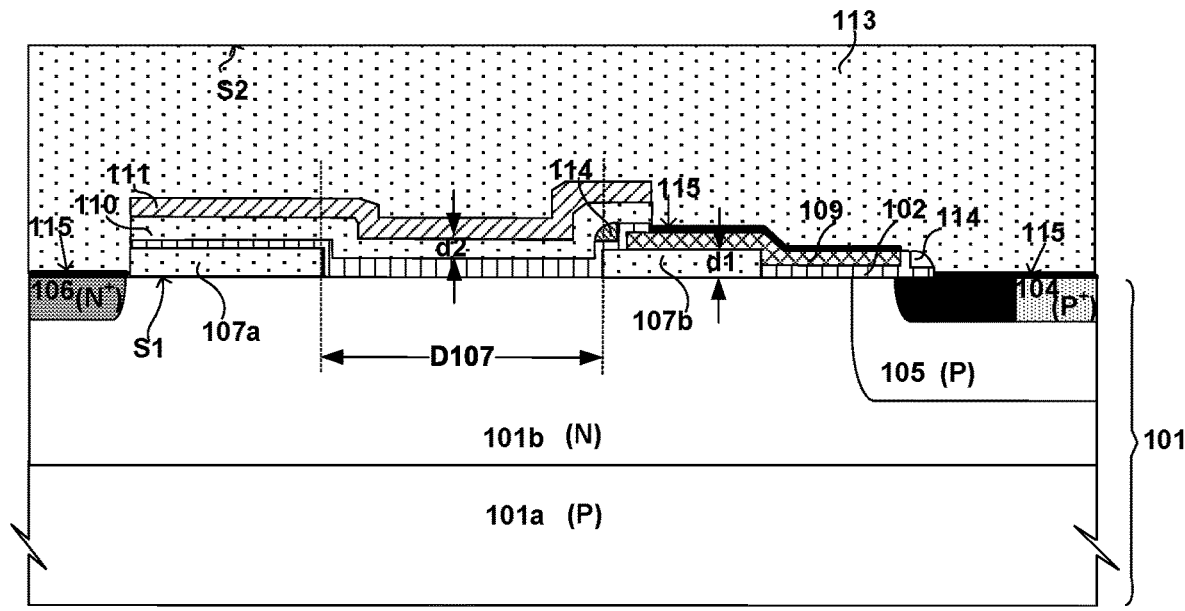

Referring to FIG. 4J, step ST11 for forming the dielectric layer 113 in method 300 is described. In an embodiment, the dielectric layer 113 is formed by chemical vapor deposition. In another embodiment, the dielectric layer 113, the field plate oxide layer 110, the field oxide 108 and the gate insulating layer 102 comprises the same material. In an embodiment, the dielectric layer 113 comprises a mixture of silicon dioxide and silicon nitride.

Figure 4K:
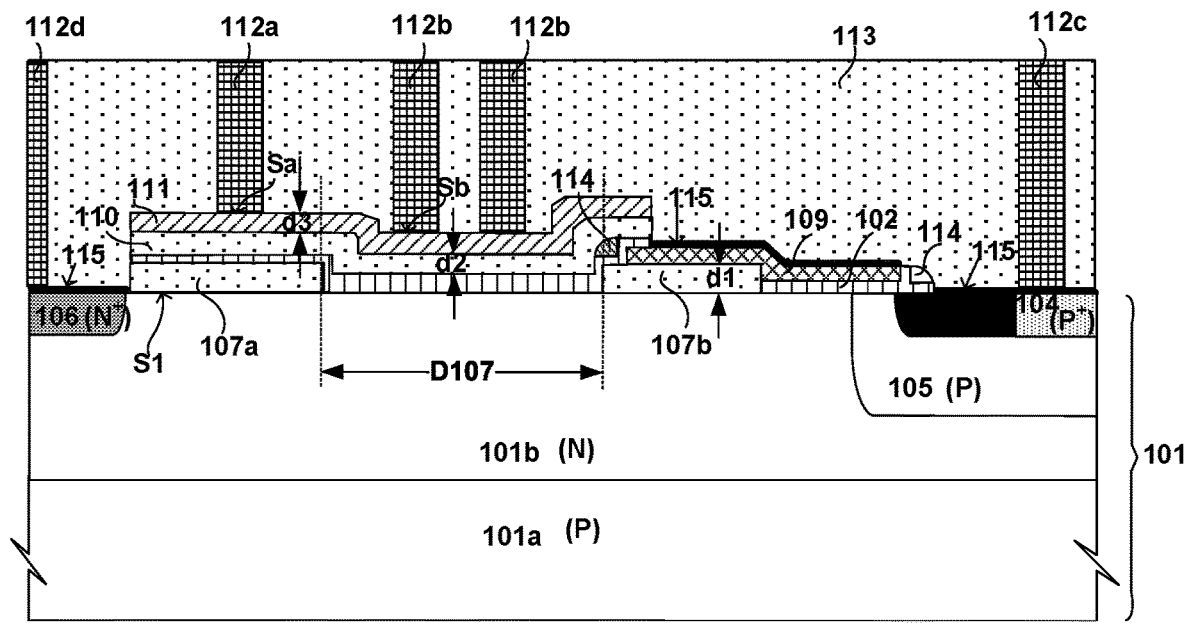

Referring to FIG. 4K, step ST12 for forming a first field plate and a second field plate in method 300 is described. In an embodiment, the first field plate 112a and the second field plate 112b are formed by a photolithography process, an etching process, and a metal deposition. Wherein the photolithography process comprises: applying a photoresist, exposing to UV with a field plate mask version, etc. In an embodiment, the etching process comprises etching the dielectric layer 113 in vertical until it encounters the field plate barrier layer 111. In an embodiment, the metal deposition comprises depositing tungsten or titanium.

For the LDMOS having the first field plate 112a and the second field plate 112b in accordance with various embodiments of the present invention, the oxide layer under the first field plate 112a is thicker than the oxide layer under the second field plate 112b, the electric field distribution in the drift region under the first field plate 112a and the second field plate 112b is optimized, thus the peak of the electric field is reduced and the breakdown voltage of the LDMOS is increased.

For the LDMOS having the first field plate 112a and the second field plate 112b in accordance with various embodiments of the present invention, the first gate oxide 107a and the second gate oxide 107b are formed by the same mask at the same time, so the performance of the LDMOS device is improved with no increase on the manufacturing cost.

Although the LDMOS according to each embodiment of the present invention is illustrated and described in this specification with the N-channel LDMOS as an example, this is not considered to be a limitation of the present invention, and it should be understood by those skilled in the art that the structures and principles given herein are equally applicable to P-channel LDMOSs and other types of semiconductor materials and semiconductor devices.

The advantages of the various embodiments of the present invention are not confined to those described above. These and other advantages of the various embodiments of the present invention will become more apparent upon reading the whole detailed descriptions and studying the various figures of the drawings.

From the foregoing, it will be appreciated that specific embodiments of the present invention have been described herein for purposes of illustration, but that various modifications may be made without deviating from the technology. Many of the elements of one embodiment may be combined with other embodiments in addition to or in lieu of the elements of the other embodiments. Accordingly, the present invention is not limited except as by the appended claims.

What is claimed is:

1. A lateral double diffused metal oxide semiconductor field effect transistor (LDMOS), comprising:
    a semiconductor substrate having an upper surface;
    a source and a drain, formed in the semiconductor substrate;
    an interlayer dielectric layer, covering the upper surface of the semiconductor substrate, wherein the interlayer dielectric layer has an upper surface;
    a gate conducting layer, disposed in the interlayer dielectric layer between the source and the drain, the gate conducting layer comprises a plate portion and a channel portion, wherein the height of the plate portion to the upper surface of the semiconductor substrate is greater than the height of the channel portion to the upper surface of the semiconductor substrate;

a field plate barrier layer, disposed in the interlayer dielectric layer between the plate portion and the drain;

a first field plate, disposed in the interlayer dielectric layer and extending from the field plate barrier layer through the interlayer dielectric layer to the upper surface of the interlayer dielectric layer, wherein the first field plate has a lower surface in contact with the field plate barrier layer; and a second field plate, disposed in the interlayer dielectric layer and extending from the field plate barrier layer through the interlayer dielectric layer to the upper surface of the interlayer dielectric layer, wherein the second field plate has a lower surface in contact with the field plate barrier layer;

wherein the height of the lower surface of the first field plate to the upper surface of the semiconductor substrate is greater than the height of the lower surface of the second field plate to the upper surface of the semiconductor substrate, and the height of the lower surface of the second field plate to the upper surface of the semiconductor substrate is greater than the height of the plate portion to the upper surface of the semiconductor substrate.

2. The LDMOS of claim 1, wherein the field plate barrier layer comprises nitride.

* * * * *